(12) United States Patent
Yen et al.

(10) Patent No.: US 10,497,777 B2
(45) Date of Patent: Dec. 3, 2019

(54) SEMICONDUCTOR POWER DEVICE

(71) Applicant: Hestia Power Inc., Hsinchu (TW)

(72) Inventors: Cheng-Tyng Yen, Hsinchu (TW);
Chien-Chung Hung, Hsinchu (TW);
Chwan-Ying Lee, Hsinchu (TW)

(73) Assignee: HESTIA POWER INC., Hsinchu (TW)

( * ) Notice: Subject to any disclaimer, the term of this patent is extended or adjusted under 35 U.S.C. 154(b) by 4 days.

(21) Appl. No.: 15/699,426

(22) Filed: Sep. 8, 2017

(65) Prior Publication Data

US 2019/0081136 A1    Mar. 14, 2019

(51) Int. Cl.

| | |
|---|---|
| *H01L 29/66* | (2006.01) |
| *H01L 29/06* | (2006.01) |
| *H01L 29/78* | (2006.01) |
| *H01L 29/16* | (2006.01) |
| *H01L 29/10* | (2006.01) |
| H01L 29/739 | (2006.01) |

(52) U.S. Cl.
CPC ...... *H01L 29/0634* (2013.01); *H01L 29/0696* (2013.01); *H01L 29/1095* (2013.01); *H01L 29/1608* (2013.01); *H01L 29/66674* (2013.01); *H01L 29/7802* (2013.01); *H01L 29/7395* (2013.01)

(58) Field of Classification Search
CPC ............. H01L 29/0634; H01L 29/1095; H01L 29/0696; H01L 29/1608; H01L 29/7395; H01L 29/7802; H01L 29/36–365; H01L 21/823493; H01L 21/823885; H01L 21/82345; H01L 21/823456; H01L 21/823462; H01L 21/8236; H01L 21/823842; H01L 21/82385; H01L 21/823857; H01L 27/0635; H01L 27/0705–0722; H01L 27/085–098; H01L 27/105–11597; H01L 29/7831–7833; H01L 29/78–7801; H01L 29/66674; H01L 29/66681; H01L 29/66659
See application file for complete search history.

(56) References Cited

U.S. PATENT DOCUMENTS 5,170,231 A    12/1992   Fujii et al.
6,165,822 A    12/2000   Okuno et al.
(Continued)

OTHER PUBLICATIONS

J. Rozen et al., "Scaling Between Channel Mobility and Interface State Density in SiC MOSFETs", IEEE Transactions on Electron Devices, Sep. 26, 2011, pp. 3808-3811, vol. 58, No. 11, USA.
J. Rozen et al. "The Limits of Post Oxidation Annealing in NO", Materials Science Forum, Apr. 29, 2010, pp. 693-696, vols. 645-648, Switzerland.
(Continued)

*Primary Examiner* — Jarrett J Stark
(74) *Attorney, Agent, or Firm* — Muncy, Geissler, Olds & Lowe, P.C.

(57) ABSTRACT

A semiconductor power device includes an n-type drift layer, a plurality of first p-doped regions, a plurality of n-doped regions, a plurality of second p-doped regions, a gate dielectric layer, a gate electrode, an interlayer dielectric layer and a plurality of source contacts. Each first p-doped region includes a first p-doped portion and a plurality of first p-doped arms extending outwards from the first p-doped portion. Each n-doped region includes an n-doped portion and a plurality of n-doped arms extending outwards from the n-doped portion.

15 Claims, 8 Drawing Sheets

(56) References Cited

U.S. PATENT DOCUMENTS

| | | | |
|---|---|---|---|
| 6,204,533 B1* | 3/2001 | Williams | H01L 27/0255 |
| | | | 257/341 |
| 6,221,700 B1 | 4/2001 | Okuno et al. | |
| 6,956,238 B2 | 10/2005 | Ryu et al. | |
| 7,598,567 B2 | 10/2009 | Hefner et al. | |
| 8,377,756 B1* | 2/2013 | Arthur | H01L 29/66068 |
| | | | 438/135 |
| 8,395,162 B2 | 3/2013 | Nakano et al. | |
| 8,476,697 B1 | 7/2013 | Cooper et al. | |
| 8,507,986 B2 | 8/2013 | Arthur et al. | |
| 8,575,622 B2 | 11/2013 | Nakano | |
| 8,610,130 B2 | 12/2013 | Ryu et al. | |
| 2012/0329216 A1 | 12/2012 | Dhar et al. | |
| 2016/0284833 A1* | 9/2016 | Shimizu | H01L 29/7802 |
| 2017/0040420 A1* | 2/2017 | Mori | H01L 29/739 |
| 2017/0054017 A1* | 2/2017 | Takaki | H01L 29/66068 |
| 2018/0019309 A1* | 1/2018 | Radhakrishnan | H01L 29/1608 |
| 2018/0248016 A1* | 8/2018 | Shimizu | H01L 29/517 |

OTHER PUBLICATIONS

C. Bulucea et al., "Threshold Voltage Control in Buried Channel MOSFETs", Solid-State Electronics, Sep. 1, 1997, vol. 41, No. 9, pp. 1345-1354, United Kingdom.

S. Harada et al., "Low On-Resistance in Inversion Channel IEMOSFET Formed on 4H-SiC C-Face Substrate", Proceedings of the 18th International Symposium on Power Semiconductor Devices & IC's, Jun. 4, 2006, Naples, Italy.

S. Harada et al., "4.3mOhmcm2, 1100V 4H-SiC Implantation and Epitaxial MOSFET", Materials Science Forum, Oct. 15, 2006, pp. 1281-1284, vols. 527-529, Switzerland.

W. E. Wagner et al., "Characterization of Silicon Carbide Epitaxial Channel MOSFETs", IEEE Transactions on Electron Devices, Nov. 1, 2000, pp. 2214-2219, vol. 47, No. 11, USA.

Y. K. Sharma et al., "Phosphorous passivation of the SiO2 /4H-SiC interface", Solid State Electronics, Nov. 16, 2011, pp. 103-107, 68 (2012), USA.

C. T. Yen et al., "SiC Epi-Channel Lateral MOSFETs" Materials Science Forum, Feb. 26, 2014, pp. 927-930, vols. 778-780 (2014), Switzerland.

* cited by examiner

SEMICONDUCTOR POWER DEVICE

FIELD OF THE INVENTION

The present invention relates to a semiconductor power device, and particularly to a semiconductor power device having low on-resistance.

BACKGROUND OF THE INVENTION

Semiconductor power devices are looking for low on-resistance, and fast switching to reduce conduction loss and switching loss. Common semiconductor power switches include metal-oxide semiconductor field-effect transistors (MOSFET), insulated gate bipolar transistors (IGBT) and junction field-effect transistors (JFET).

Taking MOSFET as an example, the U.S. Pat. No. 7,598,567 discloses a power switching semiconductor device with rectifying junction shunts capable of reducing on-resistance ($R_{DS(on)}$). The above power switching semiconductor device includes a drift layer, a first body region, a second body region, a contactor region, a shunt channel region, a first terminal and a second terminal. The drift layer comprises a first conductivity type. The first body region is adjacent to the drift layer, and comprises a second conductivity type opposite the first conductivity type. The first body region and the drift layer form a P-N junction. The second body region is on the first body region and comprises the second conductivity type. The contact region is adjacent to the first body region and the second body region and comprises the first conductivity type. The shunt channel region extends from the contactor region to the drift layer and between the first body region and the second body region, and comprises the first conductivity type. The first terminal is in electrical contact with the first body region, the second body region and the contactor region. The second terminal is in electrical contact with the drift layer.

For another example, the U.S. Pat. No. 8,377,756 discloses a MOSFET cell formed by self-aligning techniques and capable of attaining low channel resistance. The above MOFSET cell includes a U-shaped well (P-type), two parallel N-type sources formed within the well, and a plurality of N-type source rungs connected to source regions. Between every two N-type source rungs is a P-type body. The above regions are formed on an N-type epitaxial layer and an N-type substrate. A contact extends across and contacts the plurality of N-type source rungs and bodies. A gate oxide layer and a gate contact overlie a leg of a first well and a leg of a second adjacent well, enabling a gate voltage to invert the conductivity responsive of the wells.

Further, the U.S. Pat. No. 8,476,697 discloses a silicon carbide power MOSFET formed by self-aligning techniques. The silicon carbide power MOSFET includes a drain region of a first conductivity type, a base region having a second conductivity type, and a source region adjacent to an upper surface of the base region and having the first conductivity type. The base region includes a channel that extends from the source region through the base region adjacent to a gate interface thereof. The channel comprise a length less than approximately 0.6 μm. The base region comprise a doping concentration of the second conductivity type sufficiently high that the potential barrier at the source end of the channel is not lowered by the voltage applied to the drain.

In addition to the above prior art, the following disclosures may also be referred: the U.S. Pat. Nos. 5,170,231, 6,165,822, 6,221,700, 6,956,238, 8,575,622, 8,395,162, 8,507,986, and 8,610,130; the U.S. Patent Publication No. 2012/0,329,216; and non-patent publications:

1. J. Rozen, A. C. Ahyi, X. Zhu, J. R. Williams, L. C. Feldman, "Scaling Between Channel Mobility And Interface State Density in SiC MOSFETs" IEEE Transactions on Electron Devices, Vol. 58, No. 11, November 2011, pp. 3808-3811;
2. J. Rozen et al. "The Limits of Post Oxidation Annealing in NO" Materials Science Forum Vols. 645-648 (2010) pp. 693-696;
3. C. Bulucea et al. "Threshold Voltage Control in Buried Channel MOSFETs" Solid-State Electronics Vol. 41, No. 9, pp. 1345-1354, 1997;
4. S. Harada et al. "Low On-Resistance in Inversion Channel IEMOSFET Formed on 4H—SiC C-Face Substrate" Proceedings of the 18th International Symposium on Power Semiconductor Devices & IC's, Jun. 4-8, 2006 Naples, Italy;
5. S. Harada et al. "4.3 mOhmcm², 1100V 4H—SiC Implantation and Epitaxial MOSFET", Materials Science Forum Vols. 527-529 (2006) pp. 1281-1284;
6. W. E. Wagner et al. "Characterization of Silicon Carbide Epitaxial Channel MOSFETs" IEEE Transactions on Electron Devices, vol. 47, no. 11, November 2000, pp. 2214-2219;
7. Y. K. Sharma et al. "Phosphorous passivation of the $SiO_2$/4H—SiC interface" Solid State Electronics, 68 (2012) pp. 103-107; and
8. C. T. Yen et al. "SiC Epi-Channel Lateral MOSFETs" Materials Science Forum Vols. 778-780 (2014) pp. 927-930.

The on-resistance $R_{DS(on)}$ of MOSFET can written as:

$$R_{DS(on)} = \frac{L_{ch}}{W_{ch}} \cdot \frac{1}{\mu_n C_{ox}(V_G - V_{th})} \quad (1)$$

Where $L_{ch}$ is the channel length, $W_{ch}$ is the channel width, $\mu_n$ is the channel mobility, $C_{ox}$ is the oxide capacitance, $V_G$ is the gate voltage, and $V_{th}$ is the gate threshold voltage.

When a gate dielectric is formed in a silicon carbide MOSFET by thermal oxidation, unreacted carbon may remain at the interface between the gate dielectric and the silicon carbide to form defects such as silicon vacancy, carbon clusters or carbon interstitial, these defects create energy states within the band gap and become acceptor traps or donor traps. In general, the SiC MOSFET used in the power applications is n-channel MOSFET. N-channels are formed by applying positive gate bias and inversing the pwell region. Those acceptor traps exist near the conduction band edge, will capture the electrons, reduce the available carriers can be used to conduct current and the filled acceptor traps will become negatively charged and act as Coulomb scattering centers for the electrons. These two effects significantly reduce the channel mobility of SiC MOSFET and result in a much higher channel resistance compared to SiC MOSFET.

One of the methods for improving the channel resistance is to use post-oxidation annealing in gases such as nitric oxide (NO), nitrous oxide ($N_2O$) or $POCl_3$ to passivate interface traps, so as to improve the channel mobility $\mu_n$ and reduce the on-resistance. Alternatively, one can improve on-resistance by using structures such as rectifying junction shunts as disclosed previously or by reducing the channel length $L_{ch}$ as disclosed in some prior arts and according to Eq.(1). However, reducing the channel length $L_{ch}$ will increase the saturation current of MOSFET due to short channel effect, which will adversely impact the short circuit withstanding time of devices.

SUMMARY OF THE INVENTION

It is a primary object of the present invention to improve the on-resistance of a semiconductor power device.

To achieve the above object, the present invention provides a semiconductor power device including: an n-type drift layer; a plurality of first p-doped regions disposed at the drift layer, each first p-doped region including a first p-doped portion and a plurality of first p-doped arms extending outwards from the first p-doped portion; a plurality of n-doped regions disposed in the first p-doped region, each n-doped region including an n-doped portion and a plurality of n-doped arms extending outwards from the n-doped portion; a plurality of second p-doped regions adjacent to the first p-doped regions; a gate dielectric layer disposed on the n-type drift layer; a gate electrode disposed on the gate dielectric layer; an interlayer dielectric layer disposed on the gate dielectric layer and the gate electrode; and a plurality of source contacts, each passing through the interlayer dielectric layer and the gate dielectric layer to form an Ohmic contact with a part of the n-doped portion and the second p-doped regions.

With the p-doped arms and the n-doped arms, the channel width density (the channel width per active region area, $W_{ch}/cm^2$) can be increased and the specific on-resistance (ron,sp) can be reduced, since the specific on-resistance can be written as, $$ron, sp = R_{DS(on)} * A = \frac{L_{ch}}{W_{ch}/A} \cdot \frac{1}{\mu_n C_{ox}(V_G - V_{th})}, \quad (2)$$

where A is the area. According to Eq.(2), by increasing the channel width density ($W_{ch}/cm^2$), the specific on-resistance will be lower, and the on-resistance for a specified area will be lower.

Further, when designing a semiconductor power device, a minimum rule on the distance between the source contact and the gate electrode is usually applied, according to the process capability of fabs, to avoid the risk of G/S shorting. And there is also a design rule defining the overlap between the gate electrode and the n-doped regions in order to make sure the channel can be formed by inversing the p well. The source contact also needs to be formed on the n-doped region to provide a good Ohmic contact. Conventionally, the channel width density ($W_{ch}/cm^2$) are increased by shrinking the cell pitch which usually requires a tighter design rule. In the present invention, there is no source contact provided between the outwardly extending p-doped/n-doped arms and channels are formed at both sides of the arms, hence the effective channel width in each cell is increased. Therefore, a higher channel width density is accomplished without changing the design rule. The channel width density of the present invention can still be further increased by shrinking the cell pitch with a tighter design rule.

DETAILED DESCRIPTION OF THE PREFERRED EMBODIMENTS

The present invention is more thoroughly described with the accompanying drawings below. Embodiments are depicted in these drawings. However, the present invention may be implemented in various forms and the embodiments are not to be construed as limitations to the present invention. The accompanying drawings are illustrative diagrams of ideal embodiments of the present invention. For better clarity, thickness of layers and regions may be enlarged in these drawings. Further, the drawings may not show shape changes resulted from manufacturing processes and/or tolerance. Therefore, the embodiments of the present invention are not to be construed as limiting the specific shapes of the regions in the description, and may include, for example, shape variations caused by manufacturing. For example, a rectangle usually comprises rounded corners in reality.

In the description, the layers and/or the regions are characterized as having a conductivity type such as n type or p type, which refers to the types of majority carriers in the layers and/or regions; an n-type material comprise an equilibrium excess electrons, and a p-type material comprise an equilibrium excess holes. Some materials may be marked by "+" or "−" signs to indicate that a layer or a region comprise a higher (+) or lower (−) concentration of majority carriers relative to another layer or region. The sign does not represent a specific concentration of carriers.

In the description, when a layer, region or a component of a substrate is referred as being "on" another component, it means that the layer, region or the component of a substrate is directly on the another component or there may be an intermediate component between the two. Relatively speaking, when a component is referred as being "directly on another component", the intermediate component does not exist between the two.

Figure 1:
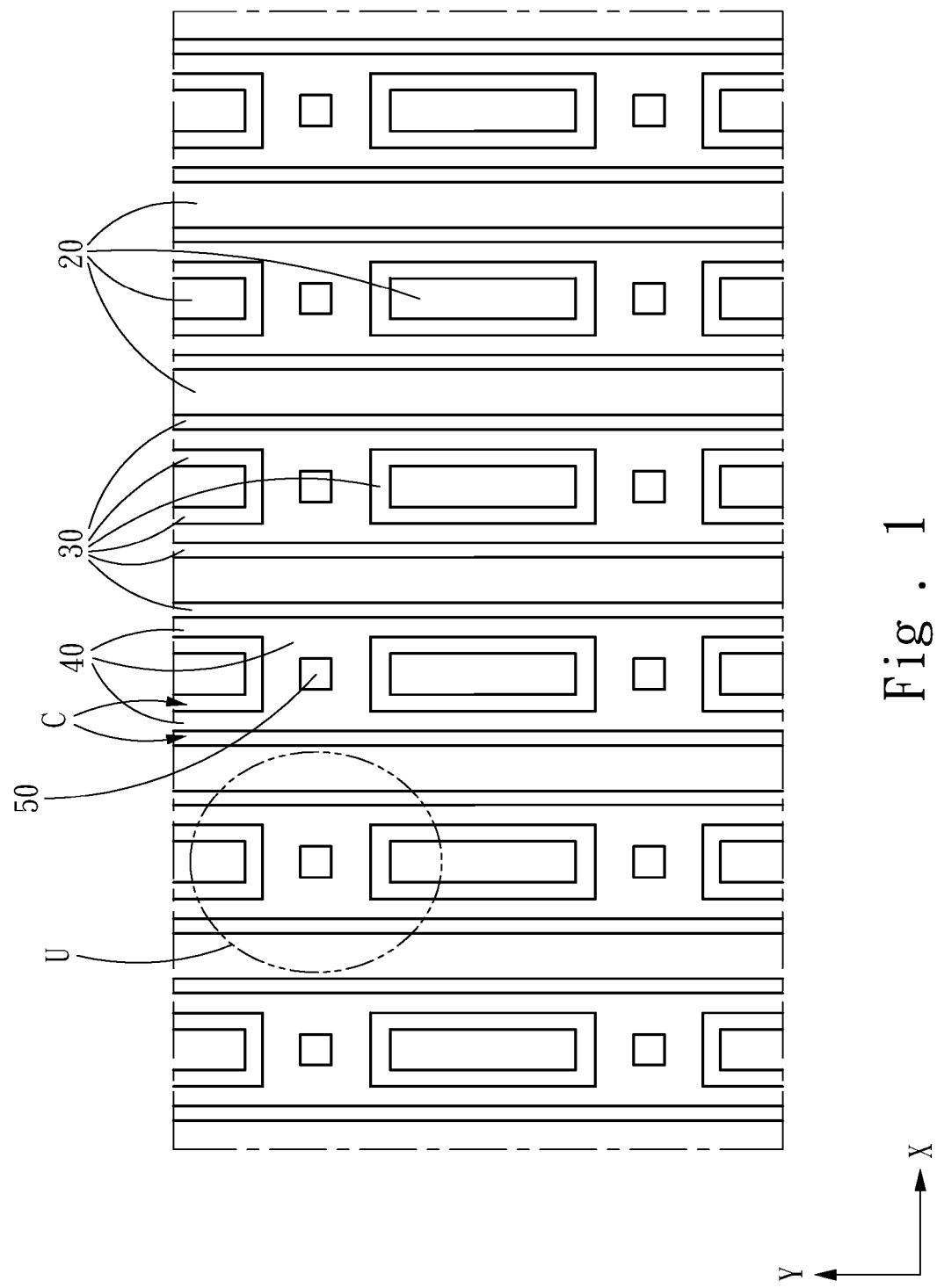
FIG. 1 is a top view according to an embodiment of the present invention.
Figure 2:
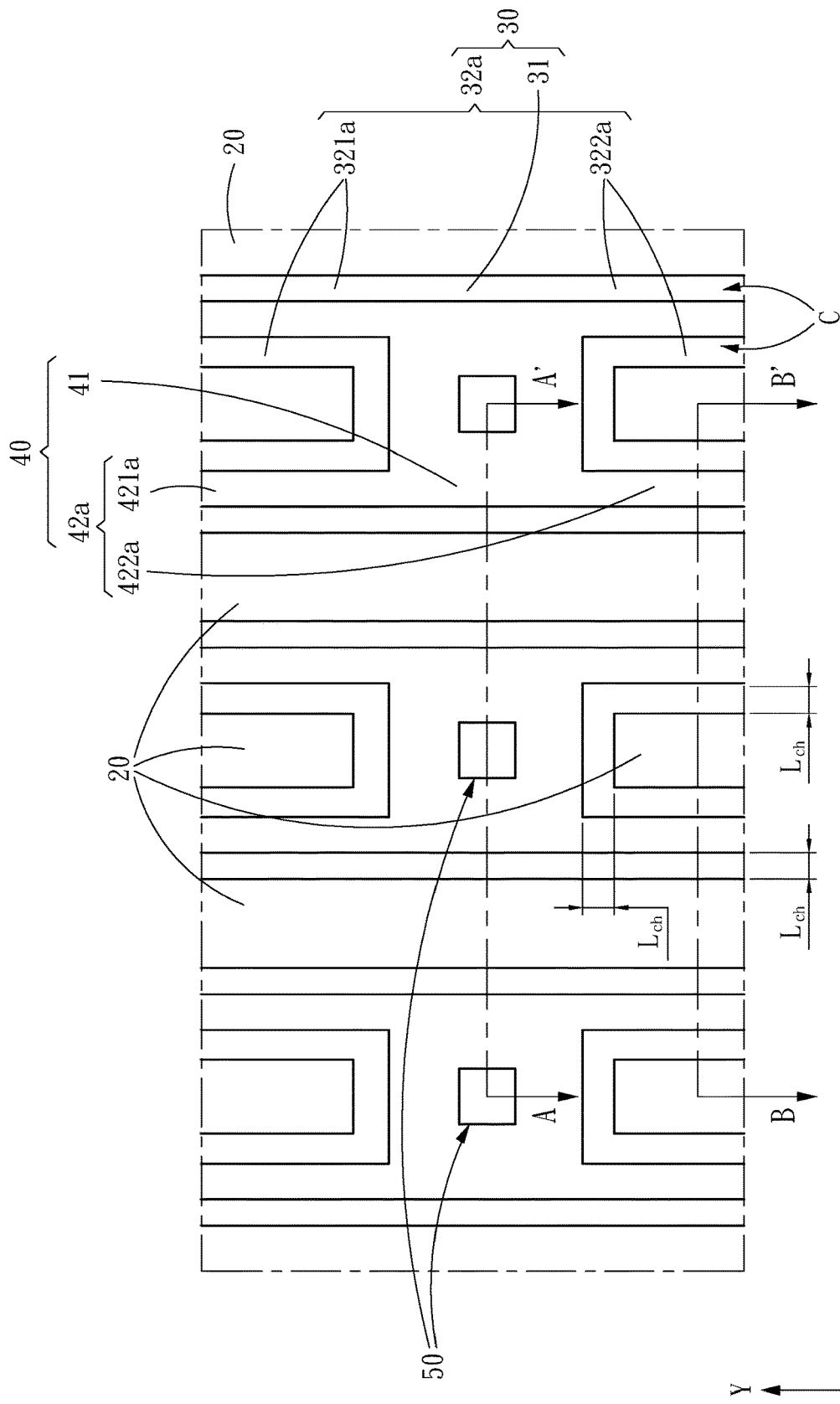
FIG. 2 is an enlarged partial view of FIG. 1.
Figure 3:
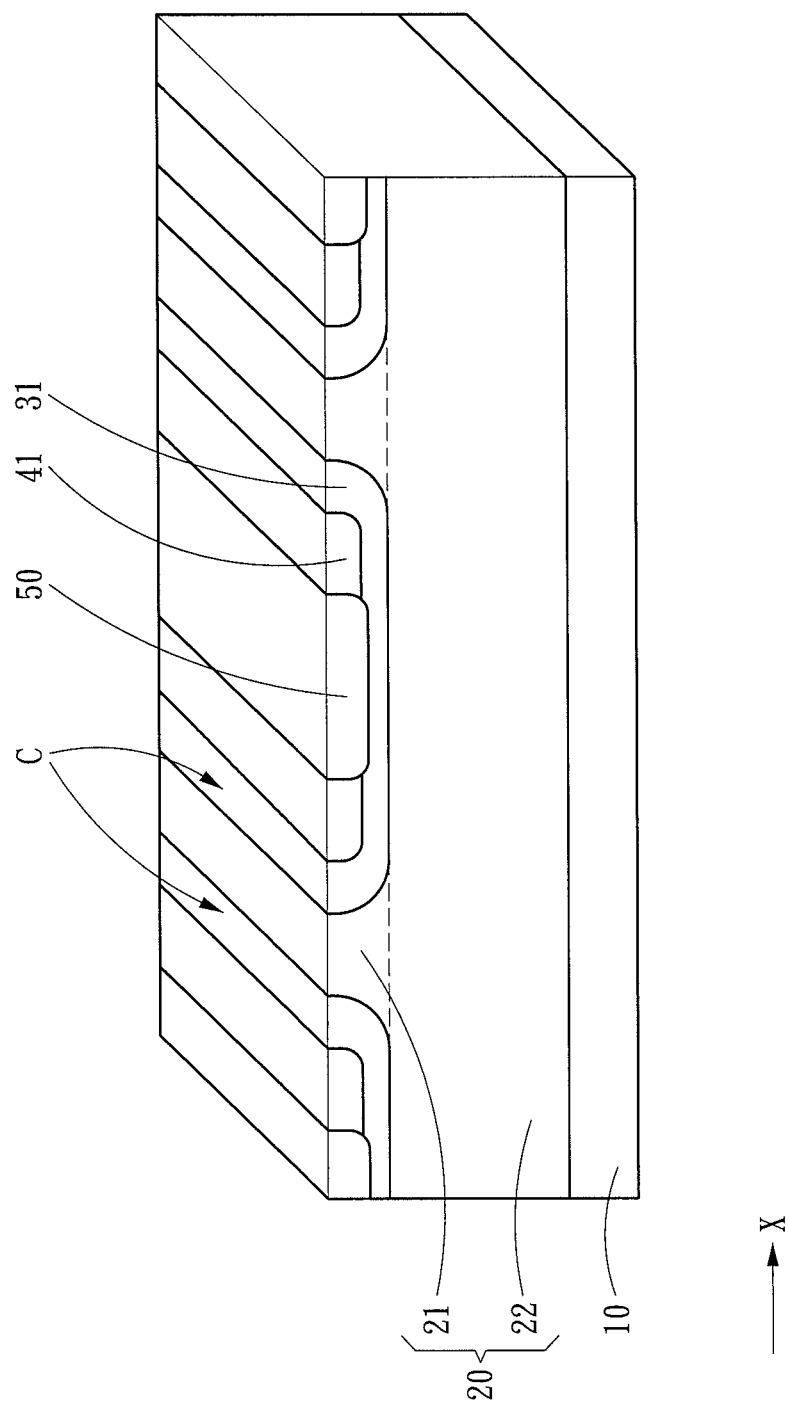
FIG. 3 is a partial perspective section view of FIG. 2 along A-A'.
Figure 4:
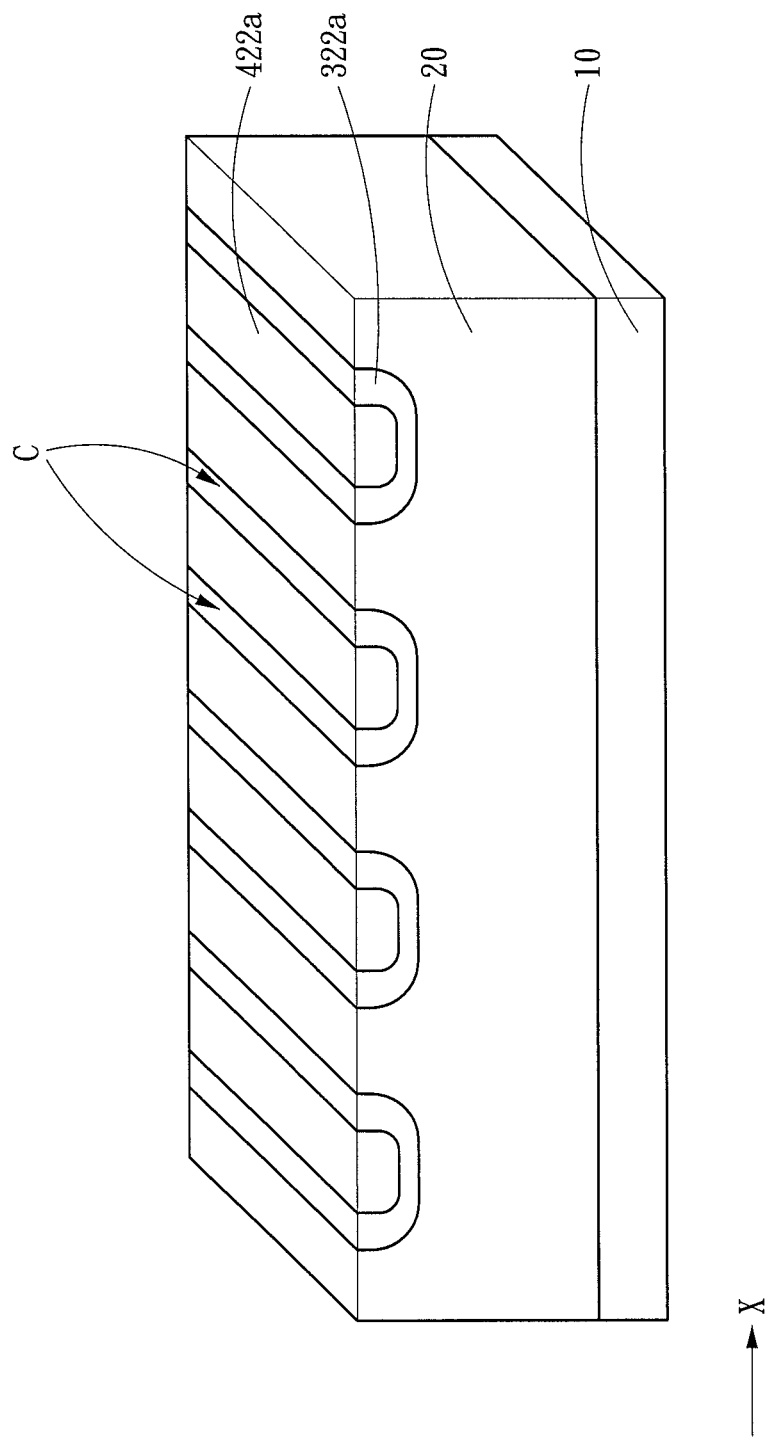
FIG. 4 is a partial perspective section view of FIG. 2 along B-B'.
Figure 5:
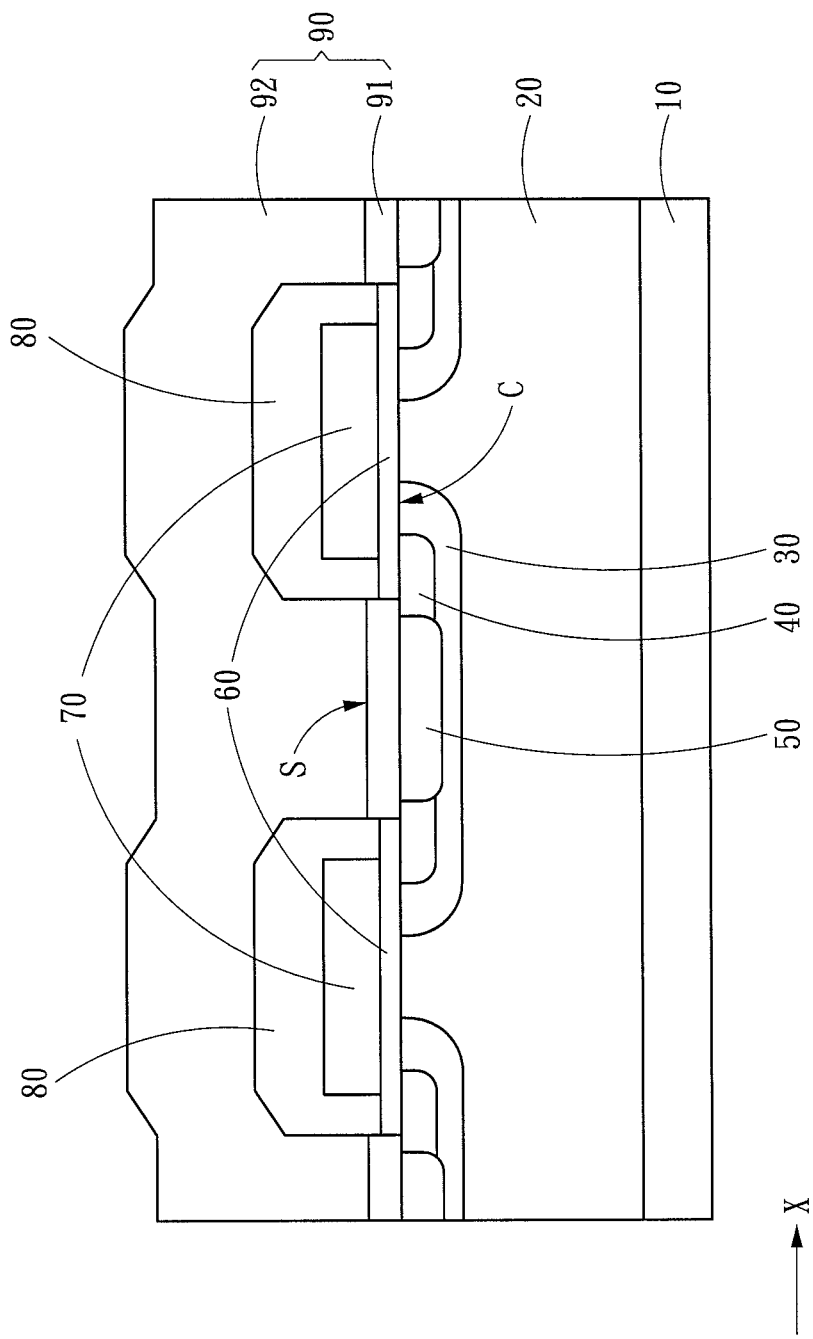
FIG. 5 is a side section view of FIG. 2 along A-A'.

FIG. 1 shows a top view according to an embodiment of present invention, FIG. 2 shows an enlarged partial view of FIG. 1, FIG. 3 shows a partial perspective section view of FIG. 2 along A-A', FIG. 4 shows a partial perspective section view of FIG. 2 along B-B', and FIG. 5 shows a side section view of FIG. 2 along A-A'. The present invention provides a semiconductor power device including a substrate 10, an n-type drift layer 20, a plurality of first p-doped regions 30, a plurality of n-doped regions 40, a plurality of second p-doped regions 50, a gate dielectric layer 60, a gate electrode 70, an interlayer dielectric layer 80, a metal layer 90 and a source contact S.

In this embodiment, the material of the substrate 10 is 4H-silicon carbide (4H—SiC) or 6H—SiC, and has a doping concentration between 1E17 $cm^{-3}$ and 1E20 $cm^{-3}$. The n-type drift layer 20 is formed on the substrate 10, and has a doping concentration between 1E14 $cm^{-3}$ and 5E17 $cm^{-3}$ and a thickness between 1 μm and 200 μm. In this embodiment, the n-type drift layer 20 comprises an upper-layer portion 21 and a lower-layer portion 22. The upper-layer portion 21 has a thickness greater than 0.1 μm and a doping concentration smaller than 1E18 $cm^{-3}$. The doping concentration of the upper-layer portion 21 is higher than that of the lower-layer portion 22. The n-type drift layer 20 is doped by an n-type impurity, such as nitrogen. The substrate 10 forms an n+ region, and the n-type drift layer 20 form's an n– region.

The plurality of first p-doped regions 30 are disposed at the n-type drift layer 20, and is formed by doping a p-type impurity, e.g., aluminum. The plurality of first p-doped regions 30 have a doping concentration between 1E16 $cm^{-3}$ and 1E19 $cm^{-3}$. The plurality of n-doped regions 40 are disposed in the plurality of first p-doped regions 30, and have a doping concentration between 1E19 $cm^{-3}$ and 1E21 $cm^{-3}$. The plurality of second p-doped regions 50 are adjacent to the plurality of n-doped regions 40, and have a doping concentration between 1E18 $cm^{-3}$ and 1E21 $cm^{-3}$. In the present invention, a channel C is formed between an outer boundary of each of the plurality of first p-doped region 30 and an outer boundary of each of the plurality of n-doped region 40, as shown in FIG. 2. The boundary used here refers to the junction formed between p-type and n-type regions. The channel C comprise a length $L_{ch}$, which is between 0.1 μm and 2 μm.

Referring to FIG. 5, the gate dielectric layer 60 is disposed on the n-type drift layer 20, and at least partially covers the plurality of first p-doped regions 30, the plurality of n-doped regions 40 and the channels C. The material of the gate dielectric layer 60 may comprise silicon dioxide, silicon oxynitride, silicon nitride, aluminum oxide and aluminum nitride or their combinations. The plurality of first p-doped regions 30 corresponding to the gate dielectric layer 60 have a surface concentration between 1E16 $cm^{-3}$ and 1E20 $cm^{-3}$. The gate electrode 70 is disposed on the gate dielectric layer 60, and the material of the gate electrode 70 may be a highly doped n-type polysilicon or a highly doped p-type polysilicon. The channels C may form an inversion channel for conducting electrons upon applying a bias to the gate electrode 70. The interlayer dielectric layer 80 is disposed on the gate dielectric layer 60 and the gate electrode 70. The material of the interlayer dielectric layer 80 may be at least one selected from TEOS tetra-ethyl-ortho-silicate (TEOS), boro-phospho-silicate-glass (BPSG), oxynitride, undoped silicate glass (USG), and silicon rich nitride (SRN). A source contact S penetrates through the interlayer dielectric layer 80 and the gate dielectric layer 60 to form an Ohmic contact with a part of the plurality of n-doped regions 40 and the plurality of second p-doped regions 50. The metal layer 90 comprises a first metal layer 91 and a second metal layer 92. The first metal layer 91 is disposed at a lower part of the source contact S, and a material thereof may be silicides formed by at least one selected from nickel, titanium and aluminum. The material of the second metal layer 92 may comprise titanium, molybdenum, nickel, aluminum, titanium silicide, molybdenum silicide, nickel silicide, aluminum silicide, titanium nitride, aluminum-copper alloy, and aluminum silicon alloy.

Referring to FIG. 2, each of the plurality of first p-doped regions 30 includes a first p-doped portion 31 and a plurality of first p-doped arms 32a extending outwards from the first p-doped portion 31; each of the plurality of n-doped region 40 includes an n-doped portion 41 and a plurality of n-doped arms 42a extending outwards from the n-doped portion 41. In the present invention, the semiconductor device may comprise multiple cells U, in the embodiment shown in FIG. 1 and FIG. 2, each of the plurality of first p-doped arm 32a includes a pair of first arms 321a and a pair of second arms 322a extending towards a direction opposite the first arms 321a. The first arm 321a of any of the plurality of first p-doped arms 32a is connected to the second arm 322a of the adjacent first p-doped arm 32a. Each of the plurality of n-doped arm 42a includes a pair of first arms 421a and a pair of second arms 422a extending towards a direction opposite the first arms 421a. The first arm 421a of any of the plurality of n-doped arms 42a is connected to the second arm 422a of the adjacent n-doped arm 42a. In other words, the cells U appear as H shapes adjacent to one another with respect to the Y-axis direction, and appear separated from one another with respect to the X-axis direction.

Figure 6A:
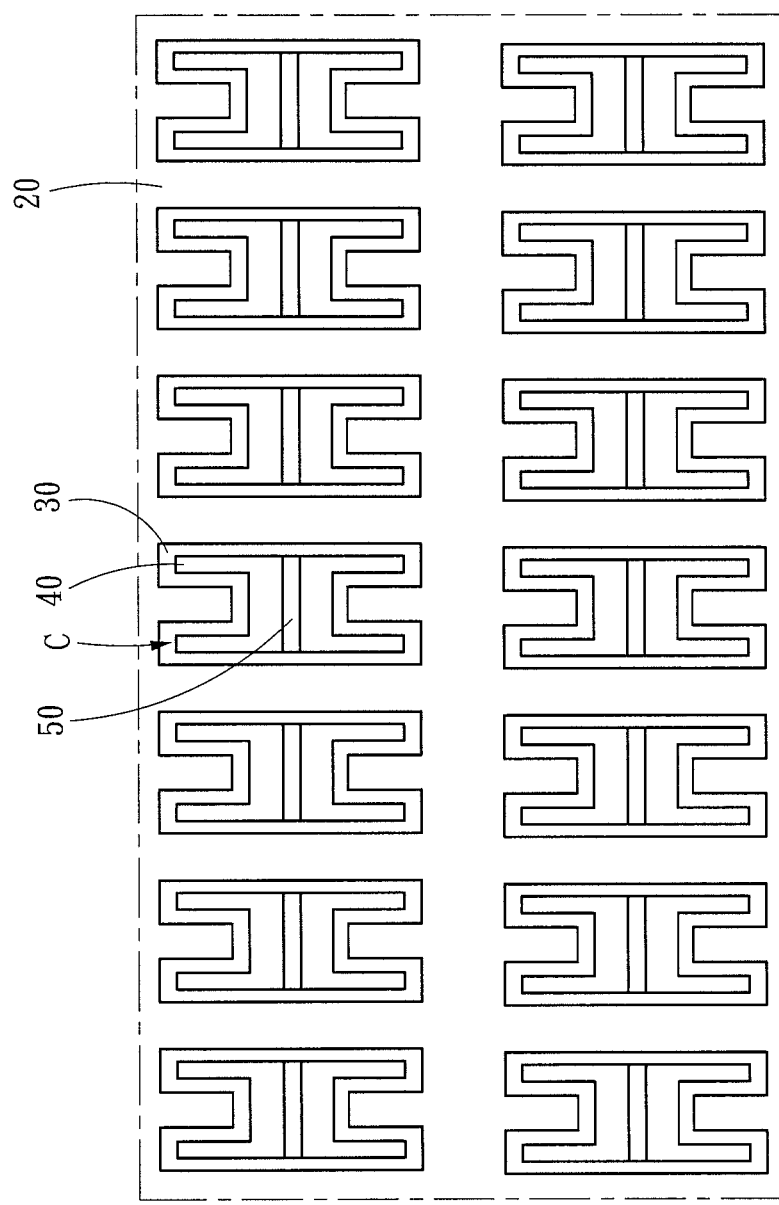
FIG. 6A is a top view according to another embodiment of the present invention.
Figure 6B:
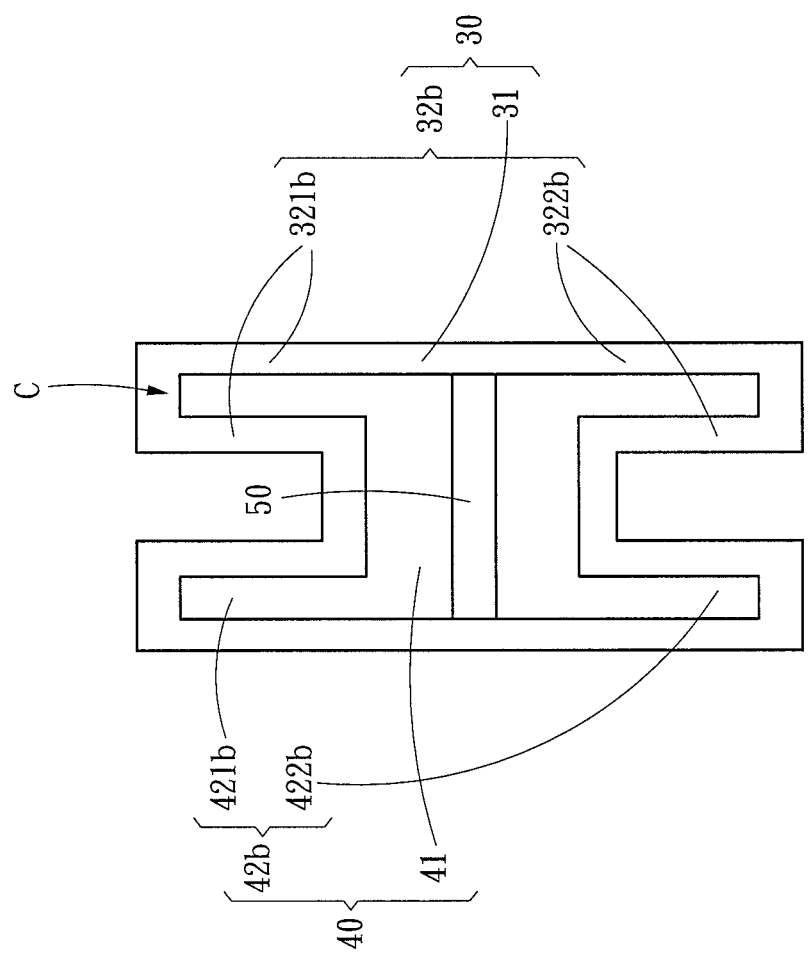
FIG. 6B is a schematic diagram of a cell in FIG. 6A.

FIG. 6A shows a top view of another embodiment, and FIG. 6B shows a schematic diagram of a cell in FIG. 6A. Referring to FIG. 6A and FIG. 6B, each of the plurality of first p-doped arms 32b includes a pair of first arms 321b and a pair of second arms 322b extending towards a direction opposite the first arms 321b. The first arm 321b of any of the plurality of first p-doped arms 32b is separated from the second arm 322b of the adjacent first p-doped arm 32b. Each of the n-doped arms 42b includes a pair of first arms 421b and a pair of second arms 422b extending towards a direction opposite the plurality of first arms 421b. The first arm 421b of any of the plurality of n-doped arms 42b is separated from the second arm 422b of the adjacent n-doped arm 42b. In other words, the cells appear as separate H shapes with respect to the Y-axis direction, and also appear separated with respect to the X-axis.

Figure 7:
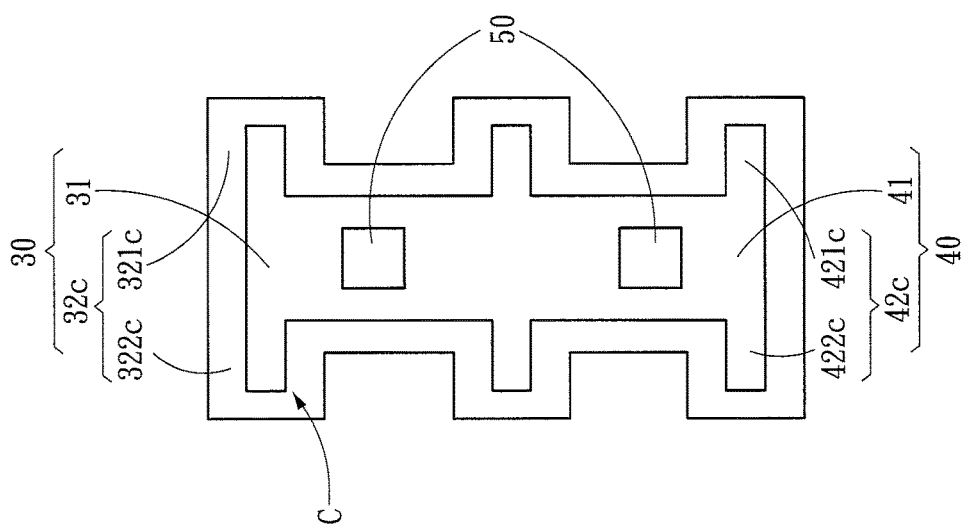
FIG. 7 is a schematic diagram of the cell according to another embodiment of the present invention.

FIG. 7 shows a schematic diagram of a cell according to yet another embodiment of the present invention. Referring to FIG. 7, each of the plurality of first p-doped arms 32c includes a plurality of first arms 321c and a plurality of second arms 322c. The first arms 321c extend along a first direction of an axis, and the second arms 322c extend along a second direction of the axis, wherein the first direction is opposite the second direction. The first arm 321c of any of the plurality of first p-doped arms 32c is separated from the second arm 322c of the adjacent first p-doped arm 32c. Each of the plurality of n-doped arms 42c includes a plurality of first arms 421c and a plurality of second arms 422c. The first arms 421c extend toward a direction same as that of the first arms 321c, and the second arms 422c extend towards a direction same as that of the second arms 322c. In this embodiment, the first arm 321c of any of the plurality of first p-doped arms 32c is separated from the second arm 322c of the adjacent first p-doped arm 32c, and the first arm 421c of any of the plurality of n-doped arms 42 is separated from the second arm 422c of the adjacent n-doped arm 42c. In this embodiment, the number of the plurality of second p-doped regions 50 in each cell is two.

Figure 8:
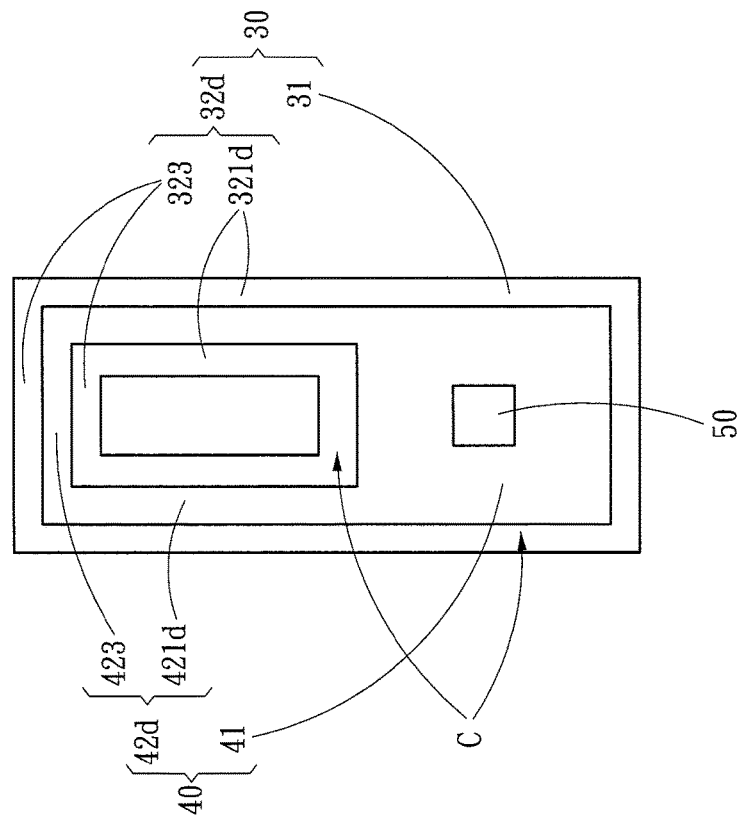
FIG. 8 is a schematic diagram of the cell according to yet another embodiment of the present invention.

FIG. 8 shows a schematic diagram of a cell according to another embodiment of the present invention. Referring to FIG. 8, each of the plurality of first p-doped arms 32d includes a pair of first arms 321d extending along a first direction of an axis, and a connecting arm 323 connecting between the first arms 321d; each of the plurality of n-doped arms 42d includes a pair of first arms 421d extending along the first direction of the axis, and a connecting arm 423 connecting between the first arms 421d.

In the present invention, the semiconductor device may be configured as a MOSFET or an IGBT.

In conclusion, by using the design of the p-doped arms and the n-doped arms, the channel width density ($W_{ch}/cm^2$) can be increased to reduce the specific on-resistance (ron, sp), as ron, sp can be written as, $$ron, sp = R_{DS(on)} * A = \frac{L_{ch}}{W_{ch}/A} \cdot \frac{1}{\mu_n C_{ox}(V_G - V_{th})}$$

By increasing the channel width of each cell ($W_{ch}/A$), the specific on-resistance can be reduced and the on-resistance of a specific area can be decreased, or the chip area of a specific on-resistance can be decreased.

What is claimed is:

1. A semiconductor power device, comprising;
an n-type drift layer;
a plurality of first p-doped regions disposed at the n-type drift layer, each of the plurality of first p-doped regions comprising a first p-doped center portion and a plurality of first p-doped extending portions extending outwards from the first p-doped center portion in a Y-axis direction;
a plurality of n-doped regions disposed in the plurality of first p-doped regions, each of the plurality of n-doped regions center comprising an n-doped portion corresponding to the first p-doped center portion and a plurality of n-doped extending portions extending outwards from the n-doped center portion corresponding to the plurality of first p-doped extending portions in the Y-axis direction;
a plurality of second p-doped regions adjacent to the first p-doped center portion;
a gate dielectric layer disposed on the n-type drift layer;
a gate electrode disposed on the gate dielectric layer;
an interlayer dielectric layer disposed on the gate dielectric layer and the gate electrode; and
a plurality of source contacts, each of the plurality of source contacts passing through the interlayer dielectric layer and the gate dielectric layer to form an Ohmic contact with a part of the n-doped portion and the plurality of second p-doped center regions.

2. The semiconductor power device of claim 1, wherein the n-type drift layer is made of silicon carbide.

3. The semiconductor power device of claim 1, wherein each of the plurality of first p-doped extending portions comprises a pair of first arms and a pair of second arms extending towards a direction opposite the first arms, and the first arm of any of the plurality of first p-doped extending portions is connected to the second arm of the adjacent first p-doped extending portions.

4. The semiconductor power device of claim 3, wherein each of the plurality of n-doped arms comprises a pair of first arms and a pair of second arms extending towards a direction opposite the first arms, and the first arm of any of the plurality of n-doped arms is connected to the second arm of the adjacent n-doped arm.

5. The semiconductor power device of claim 1, wherein each of the plurality of first p-doped arms comprises a pair of first arms and a pair of second arins extending towards a direction opposite the first aims, and the first arm of any of the plurality of first p-doped aims is separated from the second arm of the adjacent p-doped arm.

6. The semiconductor power device of claim 5, wherein each of the plurality of n-doped arms comprises a pair of first arms and a pair of second arms extending towards a direction opposite the first arms, and the first arm of any of the plurality of n-doped arms is separated from the second arm of the adjacent n-doped arm.

7. The semiconductor power device of claim 1, wherein each of the plurality of first p-doped arms comprises a plurality of first arms extending along a first direction of an axis and a plurality of second arms extending along a second direction of the axis, and the plurality of first arms of any of the plurality of first p-doped arms are separated from the plurality of second arms of the adjacent first p-doped arm.

8. The semiconductor power device of claim 7, wherein each of the plurality of n-doped arms comprises a plurality of first arms extending along a first direction of an axis and a plurality of second arms extending along a second direction of the axis, and the plurality of first arms of any of the plurality of n-doped arms are separated from the plurality of second arms of the adjacent n-doped arm.

9. The semiconductor power device of claim 1, wherein each of the plurality of first p-doped arms comprises a pair of first arms extending along a first direction of an axis, and a connecting atm connecting between the first arms.

10. The semiconductor power device of claim 9, wherein each of the plurality of n-doped arms comprises a pair of first arms extending along a first direction of an axis and a connecting arm connecting between the first anus.

11. The semiconductor power device of claim 1, wherein a channel is formed between an outer boundary of each of the plurality of first p-doped region and an outer boundary of each of the plurality of n-doped region, and the channel comprise a length $L^{ch}$ between 0.1 μm and 2 μm.

12. The semiconductor power device of claim 1, wherein the n-type drift layer has a doping concentration not less than 1E14 cm$^{-3}$.

13. The semiconductor power device of claim 1, wherein the n-drift layer comprises an upper portion and a lower portion, and the upper portion has a thickness greater than 0.1 μm and has a doping concentration lower than 1E18 cm$^{-3}$ and higher than that of the lower portion.

14. The semiconductor power device of claim 1, wherein the plurality of first p-doped regions have a doping concentration between 1E16 cm$^{-3}$ and 1E19 cm$^{-3}$, and the plurality of n-doped regions have a doping concentration between 1E19 cm$^{-3}$ and 1E21 cm$^{-3}$, and the plurality of second p-doped regions have a doping concentration between 1E18 cm$^{-3}$ and 1E21 cm$^{-3}$.

15. The semiconductor power device of claim 1, configured as a metal-oxide semiconductor field-effect oxide (MOSFET) or an insulated gate bipolar transistor (IGBT).

* * * * *